(12) United States Patent
Kim et al.

(10) Patent No.: US 11,437,246 B2
(45) Date of Patent: Sep. 6, 2022

(54) ETCHANT COMPOSITIONS AND METHODS OF MANUFACTURING INTEGRATED CIRCUIT DEVICES USING THE SAME

(71) Applicant: Samsung Electronics Co., Ltd., Suwon-si (KR)

(72) Inventors: Youngchan Kim, Suwon-si (KR); Youngtak Kim, Hwaseong-si (KR); Jungah Kim, Hwaseong-si (KR); Hoon Han, Anyang-si (KR); Geunjoo Baek, Cheonan-si (KR); Chisung Ihn, Cheonan-si (KR); Sangmoon Yun, Cheonan-si (KR)

(73) Assignees: Samsung Electronics Co., Ltd., Suwon-si (KR); SAMYOUNG PURE CHEMICALS CO., LTD., Cheonan-si (KR)

( * ) Notice: Subject to any disclaimer, the term of this patent is extended or adjusted under 35 U.S.C. 154(b) by 0 days.

(21) Appl. No.: 17/008,736

(22) Filed: Sep. 1, 2020

(65) Prior Publication Data
US 2021/0202264 A1    Jul. 1, 2021

(30) Foreign Application Priority Data
Dec. 27, 2019 (KR) .......... 10-2019-0176896

(51) Int. Cl.
*H01L 21/321* (2006.01)
*H01L 21/3213* (2006.01)
(Continued)

(52) U.S. Cl.
CPC .. *H01L 21/32134* (2013.01); *H01L 21/30604* (2013.01); *H01L 21/31111* (2013.01)

(58) Field of Classification Search
CPC ......... H01L 21/32134; H01L 21/30604; H01L 21/31111
(Continued)

(56) References Cited

U.S. PATENT DOCUMENTS

| 6,391,145 B1 | 5/2002 | Nishimoto et al. |
| 7,759,258 B2 | 7/2010 | Du |

(Continued)

FOREIGN PATENT DOCUMENTS

| CN | 104362092 | 2/2015 |
| JP | 2014212138 | 11/2014 |

(Continued)

OTHER PUBLICATIONS

Translation of KR20080106695A (Year: 2008).*

*Primary Examiner* — Duy Vu N Deo
(74) *Attorney, Agent, or Firm* — Myers Bigel, P.A.

(57) ABSTRACT

Etchant compositions described herein include etchant compositions for etching a silicon film and may include nitric acid, fluoric acid, phosphoric acid, acetic acid, a nitrogen compound, and water. The nitrogen compound may include fluorine (F), phosphorus (P), and/or carbon (C). Also described are methods of manufacturing an integrated circuit (IC) device. The methods may include providing a structure in which a silicon film doped at a first dopant concentration and an epitaxial film doped at a second dopant concentration are stacked. The second dopant concentration may be different from the first dopant concentration. The silicon film may be selectively etched from the structure by using an etchant composition.

8 Claims, 14 Drawing Sheets

(51) Int. Cl.
*H01L 21/306* (2006.01)
*H01L 21/311* (2006.01)

(58) Field of Classification Search
USPC .......................... 438/745–754; 252/79.1–79.5
See application file for complete search history.

(56) References Cited

U.S. PATENT DOCUMENTS

| 9,274,079 | B2 | 3/2016 | Shalyt et al. | |
| 2012/0295447 | A1* | 11/2012 | Tamboli | H01L 31/02363 |
| | | | | 438/753 |
| 2017/0148950 | A1* | 5/2017 | Dechoux | H01L 31/03048 |
| 2019/0284704 | A1* | 9/2019 | Ge | H01L 21/32134 |

FOREIGN PATENT DOCUMENTS

| JP | 5921091 | 5/2016 |
| KR | 1020080098772 | 11/2008 |
| KR | 1020080106695 | 12/2008 |
| KR | 1020130076760 | 7/2013 |

* cited by examiner

ETCHANT COMPOSITIONS AND METHODS OF MANUFACTURING INTEGRATED CIRCUIT DEVICES USING THE SAME

CROSS-REFERENCE TO RELATED APPLICATION

This application claims priority under 35 U.S.C. § 119 to Korean Patent Application No. 10-2019-0176896, filed on Dec. 27, 2019, in the Korean Intellectual Property Office, the disclosure of which is incorporated herein in its entirety by reference.

FIELD

The inventive concept generally relates to an etchant composition and a method of manufacturing an integrated circuit (IC) device using the same, and more particularly, to an etchant composition for etching a silicon film and a method of manufacturing an IC device using the same.

BACKGROUND

As an increase in the integration density of IC devices and an increase in the diameter of wafers have progressed rapidly, cases in which IC devices are manufactured using a structure including an epitaxial film formed by growing a crystalline material on a silicon film are gradually increasing. Also, a process of selectively removing the silicon film from the structure may be desirable to selectively leave the epitaxial film in the structure.

SUMMARY

The inventive concept provides etchant compositions capable of selectively removing a silicon film from among the silicon film and an epitaxial film.

The inventive concept also provides methods of manufacturing an integrated circuit (IC) device using an etchant composition capable of selectively removing a silicon film from among the silicon film and an epitaxial film.

According to some embodiments of the inventive concept, there is provided an etchant composition for etching a silicon film. The etchant composition includes nitric acid, fluoric acid, phosphoric acid, acetic acid, a nitrogen compound, and water. The nitrogen compound includes atoms of at least one element selected from fluorine (F), phosphorus (P), and carbon (C).

According to some embodiments of the inventive concept, there is provided an etchant composition for etching a silicon film. The etchant composition includes 10% to 20% by weight of nitric acid, 1% to 15% by weight of fluoric acid, 5% to 30% by weight of phosphoric acid, 10% to 50% by weight of acetic acid, 0.5% to 10% by weight of a nitrogen compound, and a residual amount of water, each based on a total weight of the etchant composition. The nitrogen compound may include atoms of at least one element selected from fluorine, phosphorus, and carbon.

According to some embodiments of the inventive concept, there is provided an etchant composition for etching a doped silicon film. The etchant composition includes 10% to 20% by weight of nitric acid, 1% to 15% by weight of fluoric acid, 5% to 30% by weight of phosphoric acid, 10% to 50% by weight of acetic acid, 0.5% to 10% by weight of a nitrogen compound, and a residual amount of water, based on a total weight of the etchant composition. The nitrogen compound may include an ammonium-based compound, urea, a urea derivative, a triazole compound, or a combination thereof and may include atoms of at least one element selected from fluorine, phosphorus, and carbon.

According to some embodiments of the inventive concept, there is provided a method of manufacturing an IC device. The method includes preparing a structure in which a silicon film doped at a first dopant concentration and an epitaxial film doped at a second dopant concentration are stacked. The second dopant concentration is different from than the first dopant concentration. From among the silicon film and the epitaxial film, the silicon film is selectively etched by using an etchant composition including nitric acid, fluoric acid, phosphoric acid, acetic acid, a nitrogen compound, and water. The nitrogen compound includes atoms of at least one element selected from fluorine, phosphorus, and carbon.

According to some embodiments of the inventive concept, there is provided a method of manufacturing an IC device. The method includes preparing a structure in which a silicon film doped at a first dopant concentration and an epitaxial film doped at a second dopant concentration are stacked. The second dopant concentration is different from the first dopant concentration. An etchant composition coating layer is formed on a first surface of the silicon film, which is on an opposite side of the epitaxial film, by using an etchant composition including nitric acid, fluoric acid, phosphoric acid, acetic acid, a nitrogen compound, and water. The nitrogen compound includes atoms of at least one element selected from fluorine, phosphorus, and carbon. By leaving the structure to sit for a predetermined time with the silicon film covered by the etchant composition coating layer, at least a portion of the silicon film is structurally modified. The silicon film of which at least the portion is structurally modified is etched by using the etchant composition.

According to some embodiments of the inventive concept, there is provided a method of manufacturing an IC device. The method includes preparing an epitaxial wafer including a silicon substrate doped at a first dopant concentration and an epitaxial film formed on the silicon substrate and doped at a second dopant concentration. The second dopant concentration is lower than the first dopant concentration. A plurality of photoelectric conversion regions are formed in the epitaxial film. The silicon substrate is etched using an etchant composition with a plurality of photoelectric conversion regions in the epitaxial film. The etchant composition includes 10% to 20% by weight of nitric acid, 1% to 15% by weight of fluoric acid, 5% to 30% by weight of phosphoric acid, 10% to 50% by weight of acetic acid, 0.5% to 10% by weight of a nitrogen compound, and a residual amount of water, based on a total weight of the etchant composition. The nitrogen compound includes an ammonium-based compound, urea, a urea derivative, a triazole compound, or a combination thereof.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
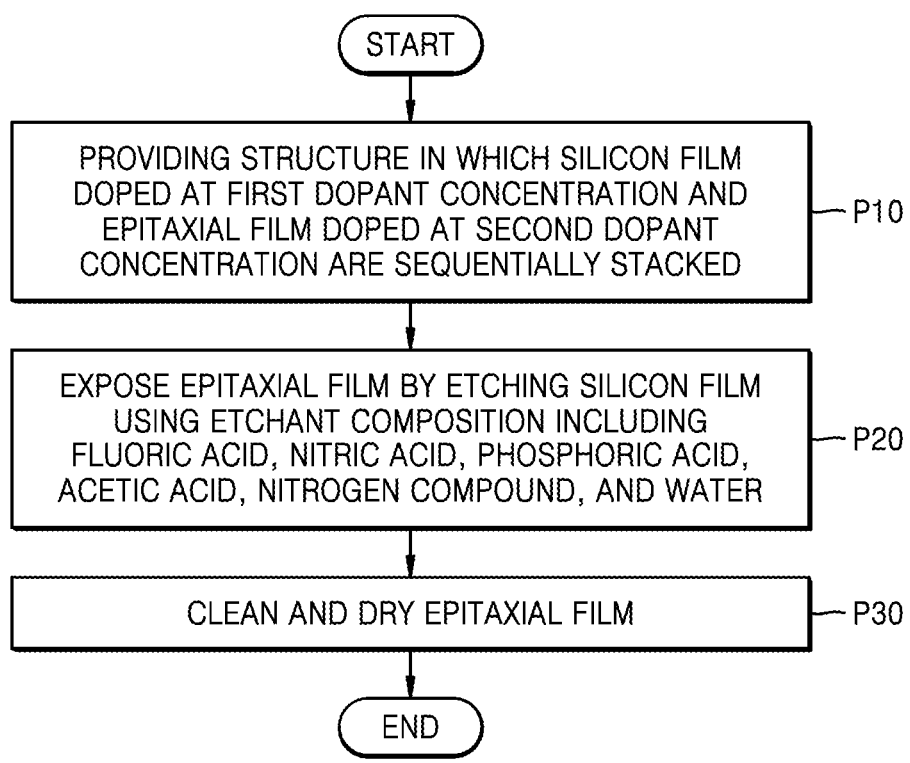
FIG. 1 is a flowchart of a method of manufacturing an integrated circuit (IC) device, according to some embodiments of the present inventive concept.

Hereinafter, some embodiments will be described in detail with reference to the accompanying drawings. The same reference numerals are used to denote the same elements in the drawings, and repeated descriptions thereof may be omitted.

An etchant composition according to some embodiments, which is an etchant composition for etching a silicon film, may include fluoric acid, nitric acid, phosphoric acid, acetic acid, a nitrogen compound, and water. The nitrogen compound may include atoms of at least one element selected from fluorine (F), phosphorus (P), and carbon (C). In some embodiments, the nitrogen compound may include F, P, and/or C. As used herein the term "and/or" includes any and all combinations of one or more of the listed items.

In example embodiments, the nitrogen compound may include an ammonium-based compound. The ammonium-based compound may include ammonium fluoride, ammonium bifluoride, ammonium acetate, ammonium phosphate monobasic, ammonium phosphate dibasic, ammonium phosphate tribasic, ammonium hydroxide, tetramethylammonium hydroxide, tetraethylammonium hydroxide, tetrabutylammonium hydroxide, tetramethylammonium fluoride, tetrabutylammonium fluoride, or a combination thereof.

In some example embodiments, the nitrogen compound may include urea and/or a urea derivative. The urea derivative may be an alkyl urea including a C1-C7 alkyl group, an alkylene urea including a C2-C7 alkylene group, a cycloalkyl urea including a C3-C8 cycloalkyl group, an aryl urea including a C6-C20 aryl group, a hydroxyalkyl urea including a C1-C7 hydroxyalkyl group, a urea phosphate, a urea nitrate, an imidazolidinyl urea, a hydroxyurea, a urea peroxide, and/or an azodicarbonamide. For example, the alkyl urea may include methyl urea, 1,1-dimethyl urea, and/or 1,3-dimethyl urea. The alkylene urea may include ethylene urea, propylene urea, and/or butylene urea. The hydroxyalkyl urea may include 2-hydroxyethyl urea. The cycloalkyl urea may include 1,3-dicyclohexyl urea. The aryl urea may include phenyl urea, 1,1-diphenyl urea, and/or 1,3-diphenyl urea.

In some example embodiments, the nitrogen compound may include an azole compound. The azole compound may include a triazole compound, a pyrrole compound, a pyrazol compound, an imidazole compound, a tetrazole compound, a pentazole compound, an oxazole compound, an isoxazole compound, a thiazole compound, and/or an isothiazole compound. For example, the azole compound may include a 1,2,4-triazole-based compound. The 1,2,4-triazole-based compound may include 1,2,4-triazole, 3-amino-1,2,4-triazole, 4-amino-1,2,4-triazole, 3,5-diamino-1,2,4-triazole, 3,5-dimethyl-1,2,4-triazole, 3-amino-5-methyl-1,2,4-triazole, 3-methyl-1,2,4-triazole-5-carboxylic acid, methyl 5-amino-1,2,4-triazole-3-carboxylate, or a combination thereof.

In the etchant composition according to some embodiments, the nitric acid may initiate an etching reaction of the silicon film to be etched and oxidize silicon. A mechanism in which silicon is oxidized by the nitric acid may be expressed by Formula 1:

$$Si + 4HNO_3 \rightarrow SiO_2 + 2H_2O + 4NO_2 \qquad \text{[Formula 1]}$$

The etchant composition may include about 10% to 20% by weight of the nitric acid, based on a total weight of the etchant composition. When a content of the nitric acid is excessively low in the etchant composition, an etch rate of the silicon film may be excessively reduced. When the content of the nitric acid is excessively high, it may be difficult to control the etch rate of the silicon film at an appropriate level, and morphology of an etched surface may become poor in the resultant structure, which remains after the silicon film is etched. As used herein, the term "content" may refer to a weight percent.

In the etchant composition according to some embodiments, the fluoric acid may dissolve silicon oxide, such as silicon oxide formed due to the nitric acid. A mechanism in which silicon oxide is dissolved due to the fluoric acid may be expressed by Formula 2:

$$SiO_2 + 6HF \rightarrow H_2SiF_6 + 2H_2O \qquad \text{[Formula 2]}$$

The etchant composition may include about 1% to 15% by weight of the fluoric acid, based on a total weight of the etchant composition. When a content of the fluoric acid is excessively low in the etchant composition, the etch rate of the silicon film may be excessively reduced. When the content of the fluoric acid is excessively high in the etchant composition, the etch rate of the silicon film may be excessively increased, and thus, an undercut phenomenon may occur in a surface to be etched or a silicon-based lower layer may be damaged.

In the etchant composition according to some embodiments, the phosphoric acid may increase etching uniformity, make a profile of the etched surface good, and serve as a pH buffer to maintain a pH value of the etchant composition at an appropriate level. Also, the phosphoric acid may maintain a viscosity of the etchant composition at an appropriate level. The etchant composition may include about 5% to 30% by weight of the phosphoric acid, based on the total weight of the etchant composition. When a content of the phosphoric acid is excessively low in the etchant composition, a profile of the surface to be etched may become poor. When the content of the phosphoric acid is excessively high, the etch rate of the silicon film may be reduced.

In the etchant composition according to some embodiments, the acetic acid may stabilize the nitric acid by reducing or inhibiting the decomposition of the nitric acid, and thus, the etch rate of the silicon film may be controlled to be at an appropriate level. In some embodiments, the acetic acid may increase the wettability of the etchant composition with respect to the surface to be etched, thereby facilitating the adsorption of the etchant composition on the surface to be etched. In addition, the acetic acid may serve as a pH buffer to maintain the pH value of the etchant composition at an appropriate level. The etchant composition may include about 10% to 50% by weight of the acetic acid, based on the total weight of the etchant composition. When a content of the acetic acid is excessively low or high in the etchant composition, it may be difficult to control the etch rate of the silicon film at an appropriate level.

In the etchant composition according to some embodiments, the nitrogen compound may maintain the etch rate of the silicon film due to the etchant composition at a constant level and increase an etch selectivity capable of selectively etching a silicon film having a dopant concentration falling within a specific range, from among silicon films having different dopant concentrations. During the etching of a desired silicon film using the etchant composition, even when a silicon film other than a film to be etched, for example, a silicon film having a dopant concentration different from a dopant concentration of the film to be etched, is exposed together to the etchant composition, the nitrogen compound may be selectively adsorbed on a surface of the silicon film having the different dopant concentration and protect the silicon film having the different dopant concentration from being etched. The nitrogen compound may be included at a content of about 0.5% to 10% by weight. When the content of the nitrogen compound is excessively low in the etchant composition, an effect of maintaining the etch selectivity of the etchant composition constant may be reduced. When the content of the nitrogen compound is excessively high in the etchant composition, the etch rate of the silicon film to be etched may be excessively reduced.

In example embodiments, in the etchant composition, a content of the nitrogen compound may be lower than a content of each of the nitric acid, the fluoric acid, the phosphoric acid, and the acetic acid. For example, in the etchant composition according to the embodiments, the content of the nitric acid may be at least twice the content of the nitrogen compound.

In example embodiments, the etchant composition may include a composition for etching a single-crystalline silicon film doped with a P-type dopant. In example embodiments, the P-type dopant may include boron (B) atoms. In some embodiments, the etchant composition may be a composition for etching a silicon film doped with B atoms at a concentration of about $1.0 \times 10^{17}$ atoms/cm$^3$ to about $5.0 \times 10^{18}$ atoms/cm$^3$. In some embodiments, the etchant composition may be a composition for etching a single-crystalline silicon film doped with B atoms at a concentration of about $3.0 \times 10^{17}$ atoms/cm$^3$ to about $1.0 \times 10^{18}$ atoms/cm$^3$.

Figure 2A:
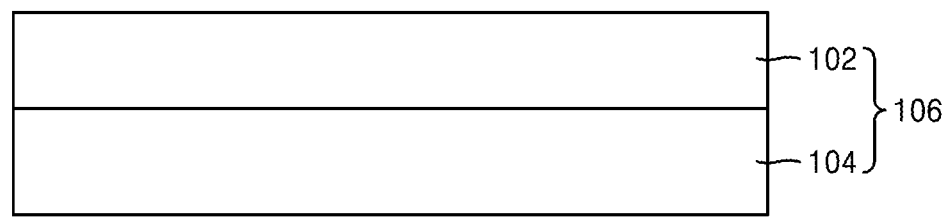
FIGS. 2A to 2C are cross-sectional views of a process sequence of a method of manufacturing an IC device, according to some embodiments of the present inventive concept.
Figure 2B:
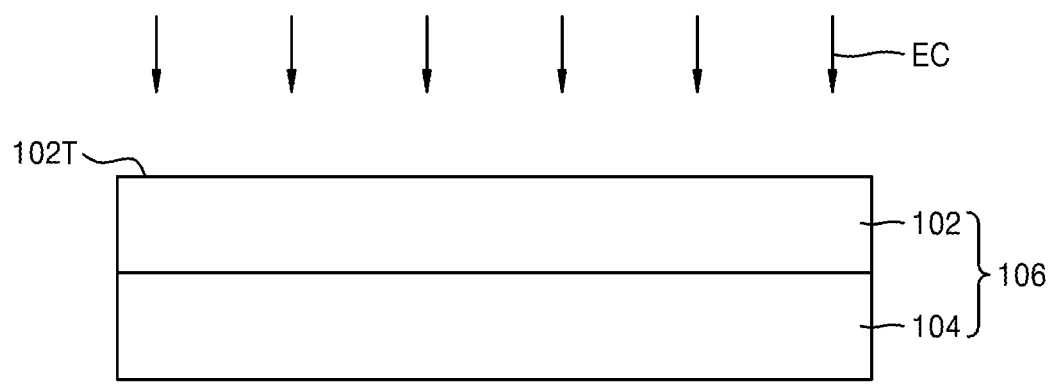
Figure 2C:

FIG. 1 is a flowchart of a method of manufacturing an integrated circuit (IC) device according to some embodiments. FIGS. 2A to 2C are cross-sectional views illustrating a method of manufacturing an IC device, according to some embodiments.

Referring to FIGS. 1 and 2A, in process P10, a structure 106 in which a silicon film 102 doped at first dopant concentration and an epitaxial film 104 doped at a second dopant concentration are stacked may be provided and/or prepared. The first dopant concentration may be higher than the second dopant concentration.

In example embodiments, the epitaxial film 104 may include a single-crystalline silicon film, which is epitaxially grown from a surface of the silicon film 102. In example embodiments, each of the silicon film 102 and the epitaxial film 104 may include a silicon film doped with a P-type dopant. For example, the silicon film 102 may include a single-crystalline silicon film doped with B atoms at a concentration of about $1.0 \times 10^{17}$ atoms/cm$^3$ to about $5.0 \times 10^{18}$ atoms/cm$^3$, and the epitaxial film 104 may include a single-crystalline silicon film doped with B atoms at a concentration of about $5.0 \times 10^{13}$ atoms/cm$^3$ to about $1.0 \times 10^{16}$ atoms/cm$^3$. A dopant concentration of the silicon film 102 may be about 10 to about $1.0 \times 10^5$ times higher than a dopant concentration of the epitaxial film 104.

In process P20 of FIG. 1, from among the silicon film 102 and the epitaxial film 104, the silicon film 102 may be selectively etched using an etchant composition EC including fluoric acid, nitric acid, phosphoric acid, acetic acid, a nitrogen compound, and water. The nitrogen compound may include atoms of at least one element selected from fluorine, phosphorus, and carbon. In some embodiments, the nitrogen compound may include fluorine, phosphorus, and/or carbon. A detailed configuration of the etchant composition EC may be the same as the above-described configuration of the etchant composition according to some embodiments of the inventive concept.

More specifically, as shown in FIG. 2B, the silicon film 102 may be etched while supplying the etchant composition EC onto a surface 102T of the silicon film 102, which is an opposite side of the epitaxial film 104, and thus, the epitaxial film 104 may be exposed as shown in FIG. 2C.

In example embodiments, the process of etching the silicon film 102 using the etchant composition EC may be performed by rotating the structure 106 using a spin method in a single-wafer-type etching apparatus configured to process one structure 106 in a single unit. For example, to etch the silicon film 102 using the etchant composition EC, the structure 106 may be rotated at a rate of about 10 revolutions per minute (rpm) to about 1000 rpm while supplying the etchant composition EC onto the silicon film 102 using a nozzle (not shown). For example, as shown in FIG. 2B, the structure 106 may be rotated at a rate of about 300 rpm to about 700 rpm during the supplying of the etchant composition EC onto the silicon film 102. The etchant composition EC may be supplied onto the silicon film 102 at a flow velocity of about 0.5 to about 1.0 L/min.

However, the inventive concept is not limited thereto. For example, the process of etching the silicon film 102 using the etchant composition EC may be performed using a batch-type etching apparatus configured to simultaneously process a plurality of structures 106.

The process of etching the silicon film 102 using the etchant composition EC may be performed at room temperature. As used herein, the term "room temperature" may range from about 20° C. to about 28° C. and depend on the season.

In process P30 of FIG. 1, the epitaxial film 104, which is exposed in the resultant structure of FIG. 2C, may be cleaned and dried.

In example embodiments, the epitaxial film 104 may be cleaned using deionized water (DIW). For example, while being rotated at a rate of about 100 rpm to about 1000 rpm, the epitaxial film 104 may be cleaned by supplying DIW onto the surface of the epitaxial film 104 at a flow velocity of about 0.5 L/min to about 2.0 L/min for about 30 seconds to about 2 minutes. The cleaned resultant structure may be dried while being rotated at a rate of about 100 rpm to about 1000 rpm. The cleaning and drying processes may be performed at room temperature.

Figure 3:
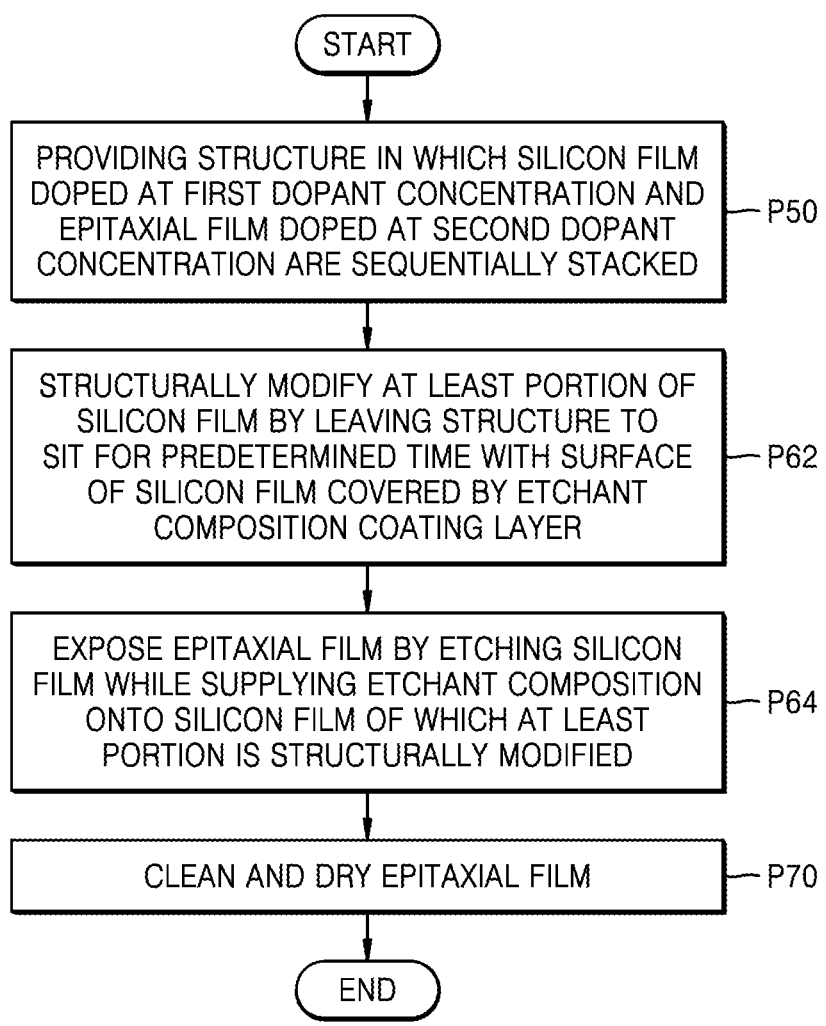
FIG. 3 is a flowchart of a method of manufacturing an IC device, according to some embodiments of the present inventive concept.
Figure 4A:
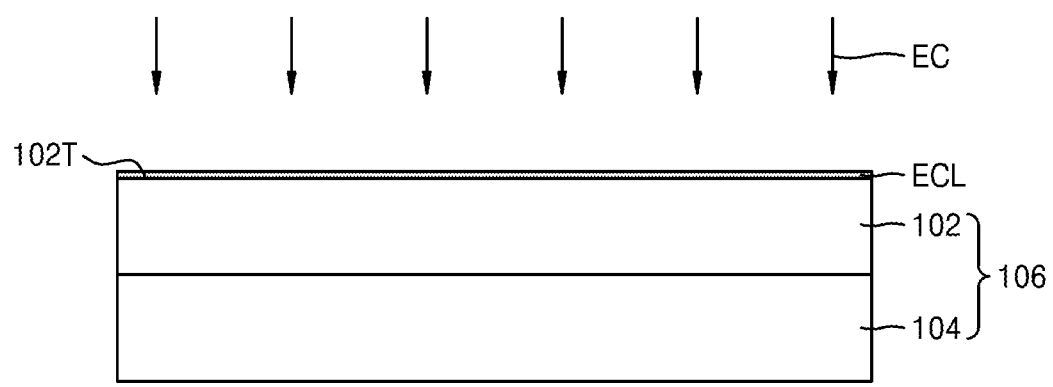
FIGS. 4A and 4B are cross-sectional views of a process sequence of a method of manufacturing an IC device, according to some embodiments of the present inventive concept.
Figure 4B:
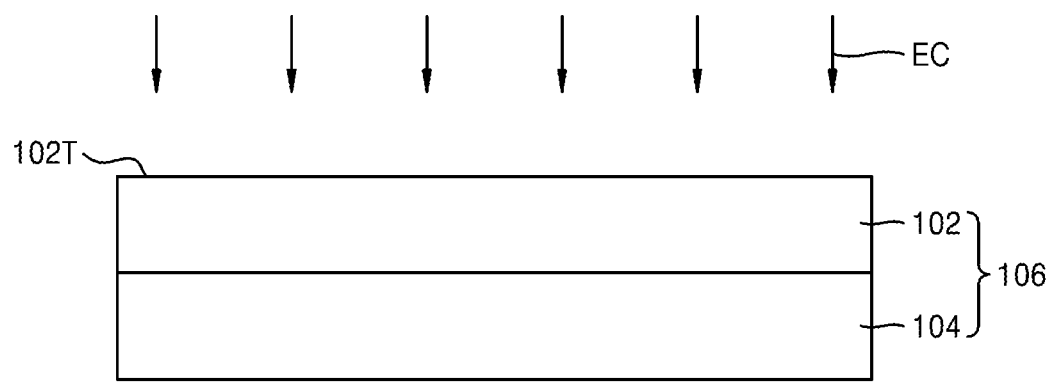

FIG. 3 is a flowchart of a method of manufacturing an IC device, according to some embodiments of the present inventive concept. FIGS. 4A and 4B are cross-sectional views of a process sequence of a method of manufacturing an IC device, according to some embodiments of the present inventive concept.

Referring to FIG. 3, in process P50, the structure 106 in which a silicon film 102 and an epitaxial film 104 are stacked may be prepared in the same manner as that described with reference to process P10 of FIG. 1 and FIG. 2A.

Referring to FIGS. 3 and 4A, in process P62, an etchant composition EC may be supplied onto a surface 102T of the silicon film 102, which is on an opposite side of the epitaxial film 104, and thus, an etchant composition coating layer ECL may be formed to cover the surface 102T of the silicon film 102. The structure 106 may be left to sit for a predetermined time with the surface 102T of the silicon film 102 covered by the etchant composition coating layer ECL, and thus, at least a portion of the silicon film 102 may be structurally modified.

In example embodiments, while the etchant composition EC is being supplied onto the surface 102T of the silicon film 102 to form the etchant composition coating layer ECL and while the structure 106 is being left to sit for the predetermined time with the surface 102T of the silicon film covered by the etchant composition coating layer ECL, the structure 106 may be rotated at a rate of about 0 rpm to about 20 rpm. To form the etchant composition coating layer ECL, the etchant composition EC may be supplied onto the surface 102T of the silicon film 102 at room temperature for about 3 seconds to about 20 seconds at a flow velocity of about 0.5 L/min to about 1.0 L/min. The leaving of the structure 106 to sit for the predetermined time with the surface 102T of the silicon film 102 covered by the etchant composition coating layer ECL may be maintained at room temperature for about 20 seconds to about 1 minute. During the leaving of the structure 106 to sit for the predetermined time with the surface 102T of the silicon film 102 covered by the etchant composition coating layer ECL, at least a portion of the silicon film 102 may be structurally modified. For example, while the structure 106 is being left to sit for the predetermined time with the surface 102T of the silicon film 102 covered by the etchant composition coating layer ECL, the nitric acid included in the etchant composition coating layer ECL may be decomposed to generate nitrous acid and hydroxyl ions (OH—). A chemical reaction of the hydroxyl ions (OH—) with silicon atoms included in the silicon film 102 may occur, and thus, at least a portion of the silicon film 102 may be oxidized to form silicon oxide. The fluoric acid included in the etchant composition coating layer ECL may dissolve at least part of silicon oxide. As a result, at least a portion of the silicon film 102 may be structurally modified with the silicon film 102 covered by the etchant composition coating layer ECL.

Referring to FIGS. 3 and 4B, in process P64, the silicon film 102 may be etched while supplying the etchant composition EC onto the silicon film 102 of which at least the portion is structurally modified. A detailed description of the process of etching the silicon film 102 according to process P64 of FIG. 3 may be the same as the description provided with reference to process 20 of FIG. 1 and FIG. 2B. As a result, the epitaxial film 104 may be exposed as shown in FIG. 2C.

In process P70 of FIG. 3, the epitaxial film 104, which is exposed, may be cleaned and dried in the same manner as that described with reference to process P30 of FIG. 1.

In the method of manufacturing the IC device, according to the embodiments, which has been described with reference to FIGS. 1 to 4B, the silicon film 102 may be selectively removed from the structure 106 including the silicon film 102 and the epitaxial film 104, which have different dopant concentrations, by using the etchant composition EC according to some embodiments of the inventive concept, and damage to the epitaxial film 104 may be reduced or minimized during the selective removal of the silicon film 102. In particular, even when there is a relatively small difference in dopant concentration between the silicon film 102 and the epitaxial film 104, the silicon film 102 may be selectively removed from the structure 106 without damaging the epitaxial film 104.

FIGS. 5A to 5J are cross-sectional views of a process sequence of a method of manufacturing an IC device, according to some embodiments of the inventive concept. A method of manufacturing an image sensor, according to an example embodiment, will be described with reference to FIGS. 5A to 5J.

Figure 5A:
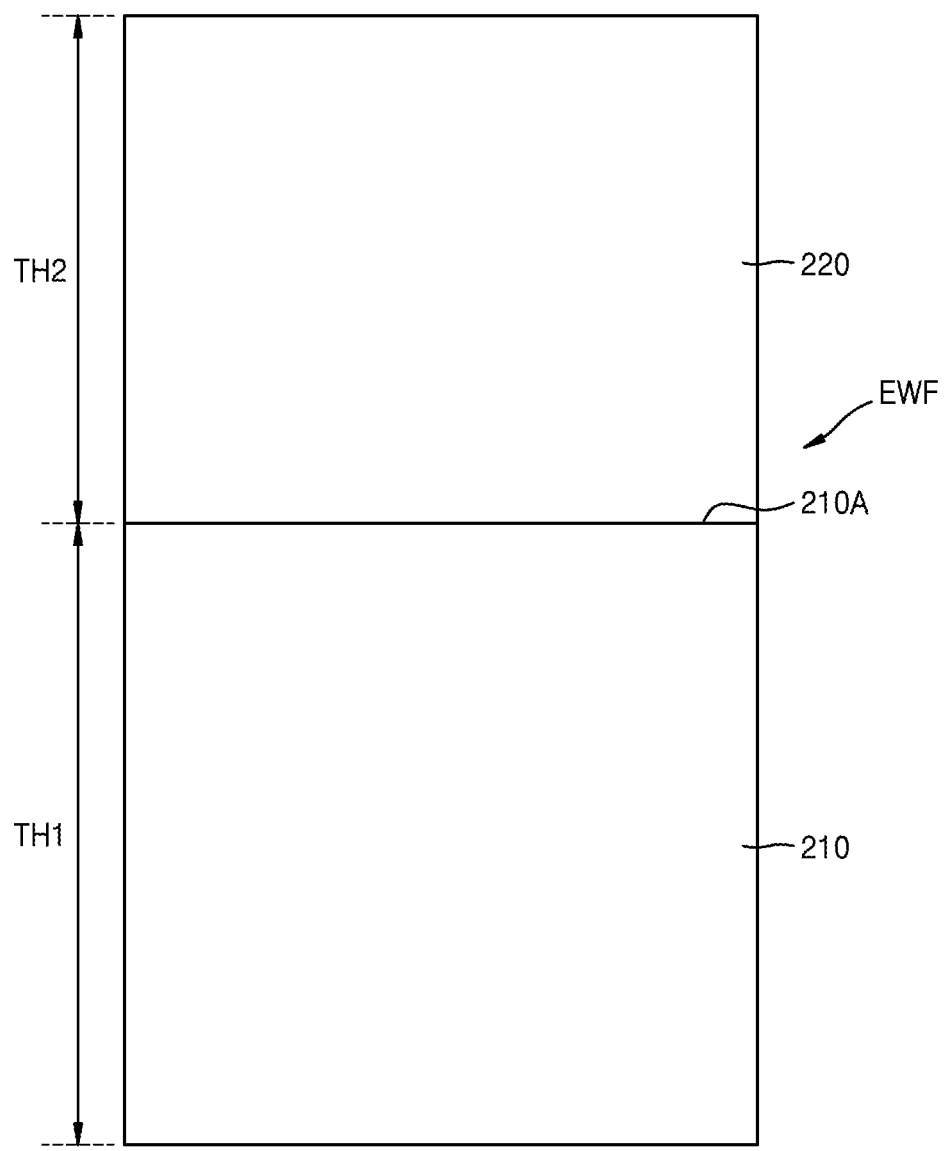
FIGS. 5A to 5J are cross-sectional views of a process sequence of a method of manufacturing an IC device, according to some embodiments of the present inventive concept.

Referring to FIG. 5A, an epitaxial wafer EWF including a silicon substrate 210 and an epitaxial film 220 formed on the silicon substrate 210 may be prepared.

The silicon substrate 210 may include a silicon film doped at a first dopant concentration, and the epitaxial film 220 may include a silicon film doped at a second dopant concentration, which is lower than the first dopant concentration.

In example embodiments, the silicon substrate 210 may include single crystalline silicon. The epitaxial film 220 may include a single-crystalline silicon film, which is epitaxially grown from a first surface 210A of the silicon substrate 210. In example embodiments, the silicon substrate 210 may include a single-crystalline silicon film doped with B atoms at a concentration of about $1.0 \times 10^{17}$ atoms/cm$^3$ to about $5.0 \times 10^{18}$ atoms/cm$^3$, and the epitaxial film 220 may include a single-crystalline silicon film doped with B atoms at a concentration of about $5.0 \times 10^{13}$ atoms/cm$^3$ to about $1.0 \times 10^{16}$ atoms/cm$^3$. For example, the silicon substrate 210 may include a single-crystalline silicon film doped with B atoms at a concentration of about $3.0 \times 10^{17}$ atoms/cm$^3$ to about $1.0 \times 10^{18}$ atoms/cm$^3$, and the epitaxial film 220 may include a single-crystalline silicon film doped with B atoms at a concentration of about $8.0 \times 10^{13}$ atoms/cm$^3$ to about $5.0 \times 10^{15}$ atoms/cm$^3$. In example embodiments, a dopant concentration of the silicon substrate 210 may be about 10 to $1.0 \times 10^5$ times higher than a dopant concentration of the epitaxial film 220.

In example embodiments, a thickness TH1 of the silicon substrate 210 may be greater than a thickness TH2 of the epitaxial film 220. For example, the thickness TH1 of the silicon substrate 210 may range from about 700 μm to about 800 μm, and the thickness TH2 of the epitaxial film 220 may range from about 5 μm to about 20 μm, for example, about 8 μm to about 12 μm, but the inventive concept is not limited thereto.

Figure 5B:
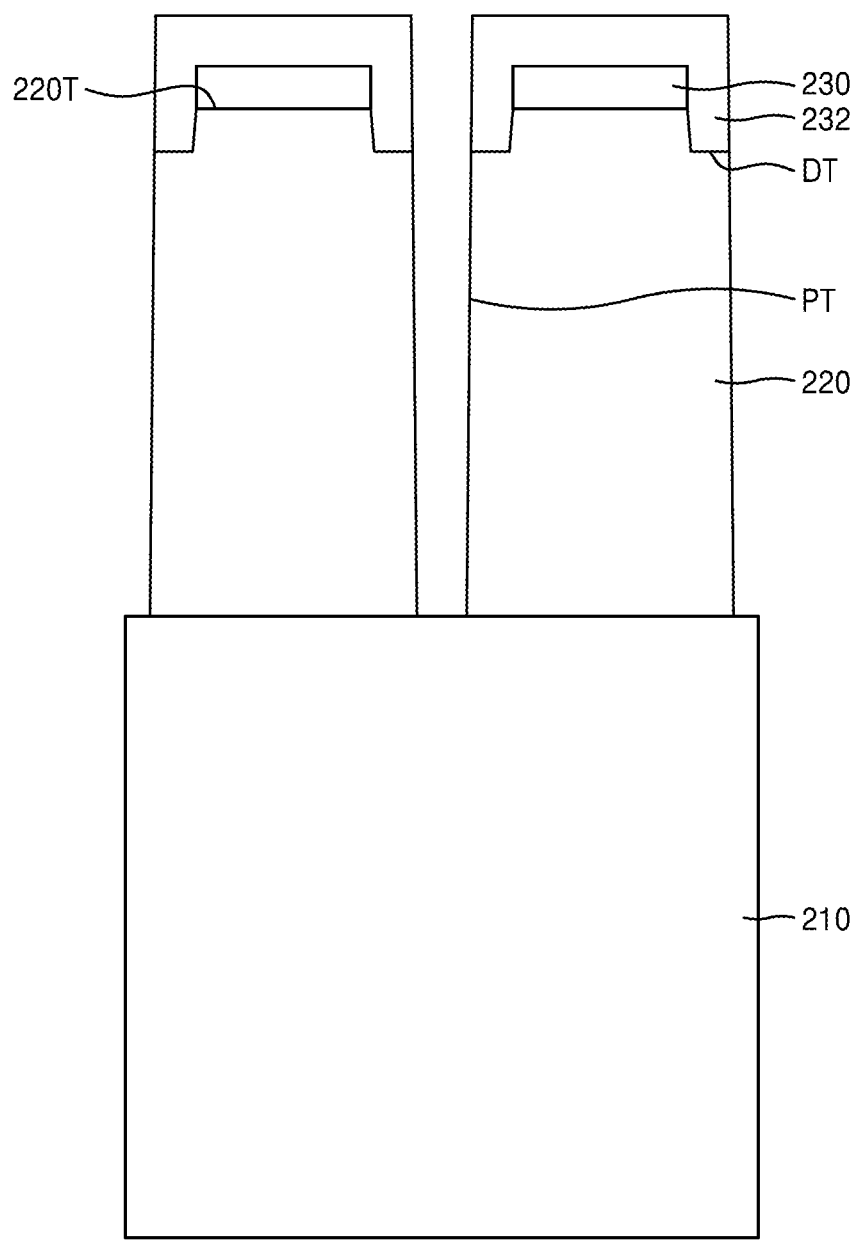

Referring to FIG. 5B, a first mask pattern 230 may be formed on a top surface 220T of the epitaxial film 220. A portion of the epitaxial film 220 may be removed from the top surface 220T of the epitaxial film 220 using the first mask pattern 230 as an etch mask, thereby forming a device isolation trench DT. A device isolation insulating film 232 may be formed on the epitaxial film 220 and the first mask pattern 230 to fill the device isolation trench DT. The device isolation insulating film 232 may include silicon oxide, silicon oxynitride, silicon nitride, or a combination thereof. Thereafter, a mask pattern (not shown) may be formed on the device isolation insulating film 232, and a pixel trench PT may be formed in the epitaxial film 220 using the mask pattern as an etch mask.

Figure 5C:
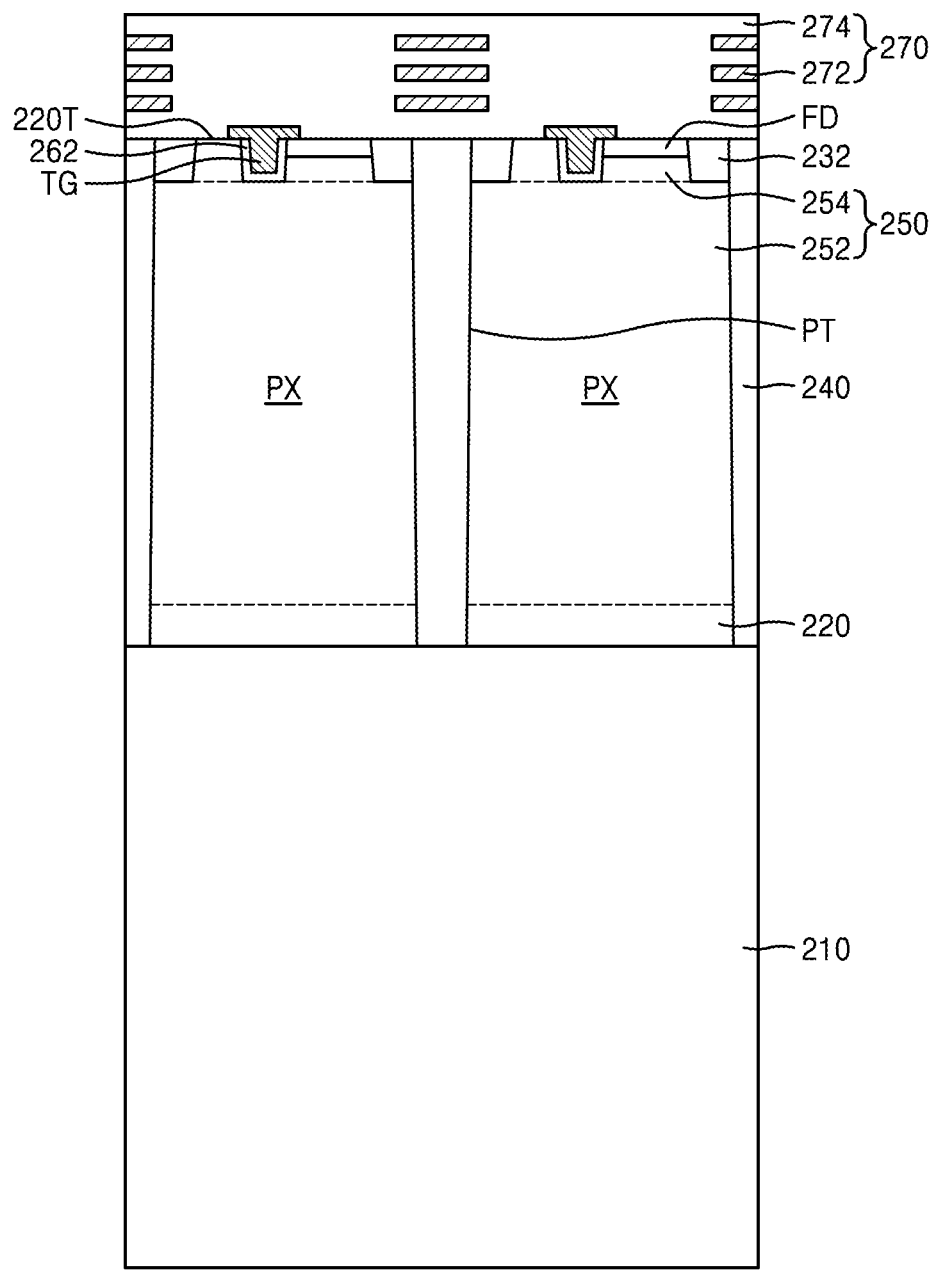

Referring to FIG. 5C, a pixel device isolation film 240 may be formed to fill the inside of the pixel trench PT. A plurality of pixel regions PX may be defined by the pixel device isolation film 240 in the silicon substrate 210. The pixel device isolation film 240 may include an insulating liner conformally covering an inner sidewall of the pixel trench PT and a buried conductive layer formed on the insulating liner to fill the inside of the pixel trench PT. The insulating liner may include a metal oxide, silicon oxide, silicon nitride, silicon oxynitride, or a combination thereof. The metal oxide may include hafnium oxide, aluminum oxide, and/or tantalum oxide. The buried conductive layer may include doped polysilicon.

Thereafter, a portion of the pixel device isolation film 240, a portion of the device isolation insulating film 232 (refer to FIG. 5B), and the first mask pattern 230 (refer to FIG. 5B) may be removed to expose the top surface 220T of the epitaxial film 220.

Subsequently, a plurality of photoelectric conversion regions 250, each of which includes a photodiode region 252 and a well region 254, may be formed through the top surface 220T of the epitaxial film 220 by using an ion implantation process. In example embodiments, the photodiode region 252 may include an N-type impurity doped region, and the well region 254 may include a P-type impurity doped region. The plurality of photoelectric conversion regions 250 may be arranged in a matrix shape in a view from above. The pixel device isolation film 240 may be arranged between the respective photoelectric conversion regions 250.

Gate structures, each of which includes a transmission gate TG and a transmission gate insulating film 262, may be formed on the epitaxial film 220, and impurity ions may be implanted into a partial region of the epitaxial film 220 from the top surface 220T of the epitaxial film 220, thereby forming a plurality of floating diffusion regions FD.

Thereafter, a lower insulating film may be formed on the top surface 220T of the epitaxial film 220 to cover the gate structures. A process of forming a plurality of interconnection patterns 272 and a process of forming a middle insulating film to cover the plurality of interconnection patterns 272 may be repeatedly performed, and thus, a multilayered interconnection structure 270 may be formed on the lower insulating film. The multilayered interconnection structure 270 may include a plurality of interconnection patterns 272 and an interlayer insulating film 274 covering the plurality of interconnection patterns 272. The interlayer insulating film 274 may include the lower insulating film and the middle insulating film.

Although FIG. 5C illustrates only a partial region of the epitaxial film 220, in which the plurality of pixel regions PX are arranged, the epitaxial film 220 may further include a peripheral circuit region (not shown) and a pad region (not shown), which are arranged around the plurality of pixel regions PX. The peripheral circuit region may be a region including various kinds of circuits configured to control the plurality of pixel regions PX. For example, the peripheral circuit region may include a plurality of transistors, which may be driven to provide a predetermined signal to each of the plurality of photoelectric conversion regions 250 or control an output signal output by each of the plurality of photoelectric conversion regions 250. For example, the plurality of transistors may constitute various kinds of logic circuits, such as a timing generator, a row decoder, a row driver, a correlated double sampler (CDS), an analog-to-digital converter (ADC), a latch, and a column decoder. The pad region may include a conductive pad, which is electrically connected to the plurality of pixel regions PX and circuits located in the peripheral circuit region. The conductive pad may serve as a connection terminal configured to provide power, and signals are provided from the outside to the plurality of pixel regions PX and the circuits located in the peripheral circuit region.

Figure 5D:
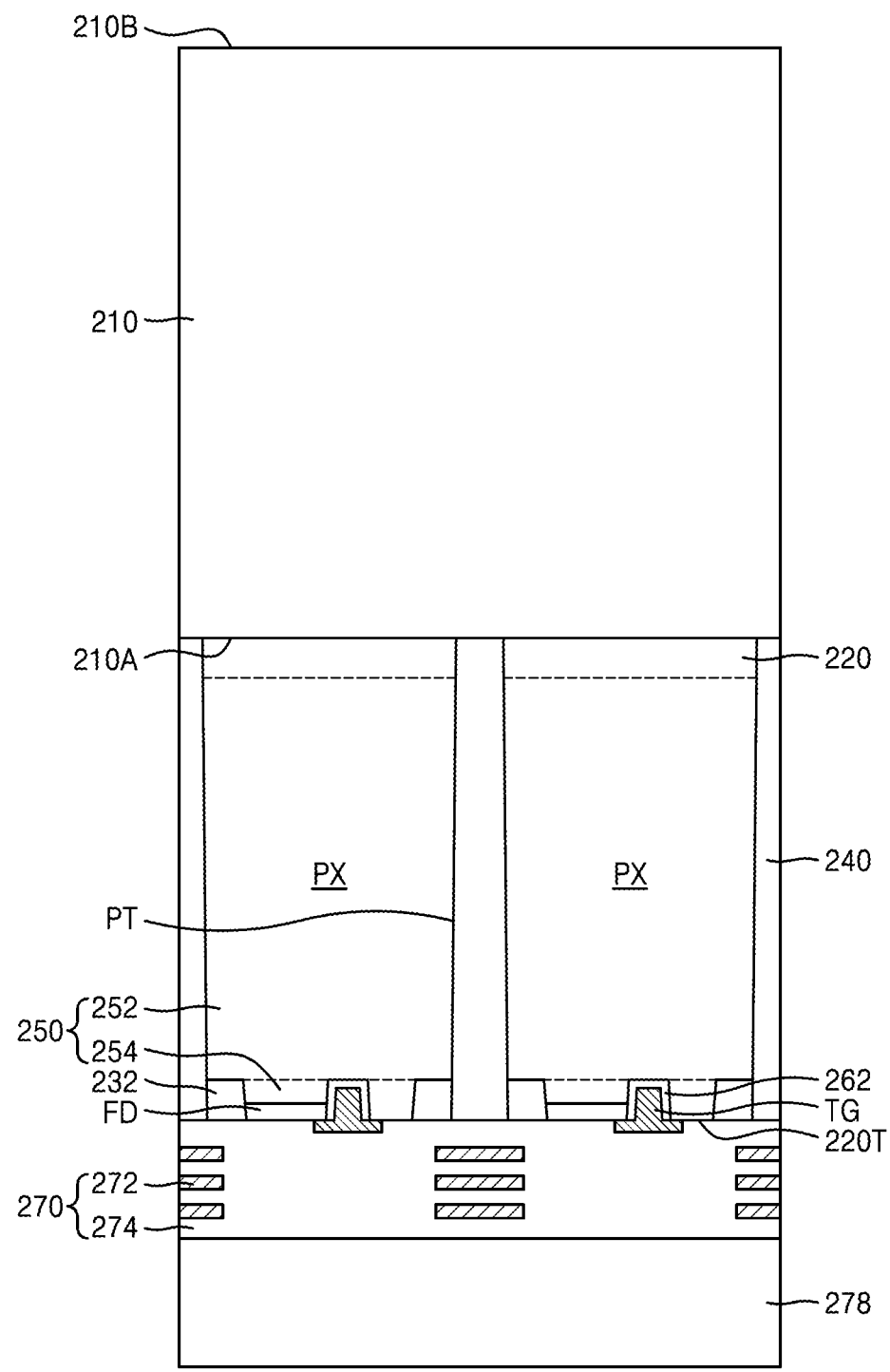

Referring to FIG. 5D, a support substrate 278 may be adhered onto the multilayered interconnection structure 270.

An adhesive layer (not shown) may be between the support substrate 278 and the interlayer insulating film 274. Thereafter, the resultant structure in which the support substrate 278 is adhered onto the multilayered interconnection structure 270 may be turned over so that a second surface 210B, which is an opposite surface of the first surface 210A of the silicon substrate 210, may face upward.

Figure 5E:
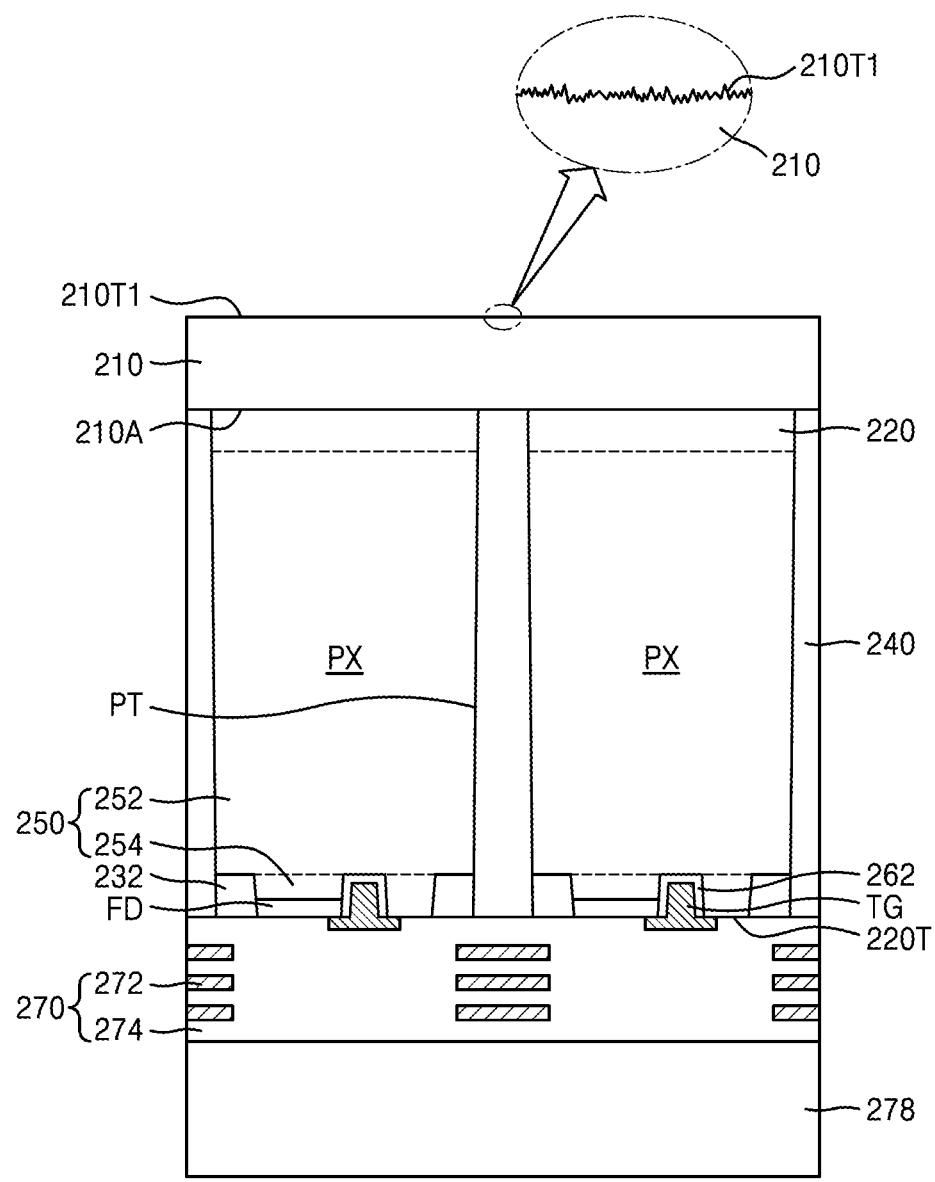

Referring to FIG. 5E, in the resultant structure of FIG. 5D in which the plurality of photoelectric conversion regions 250 are located in the epitaxial film 220, a portion of the silicon substrate 210 may be removed from the second surface 210B of the silicon substrate 210 using a dry process such as a mechanical grinding process, thereby reducing a thickness of the silicon substrate 210.

In example embodiments, the silicon substrate 210 may be removed by a partial thickness using a grinding process, and thus, the silicon substrate 210, which remains, may have a thickness of about 10 μm to about 30 for example, about 20 μm. After the thickness of the silicon substrate 210 is reduced, an exposed processed surface 210T1 of the silicon substrate 210 may include physical surface defects, such as microscratches, or have relatively large surface roughness.

Figure 5F:
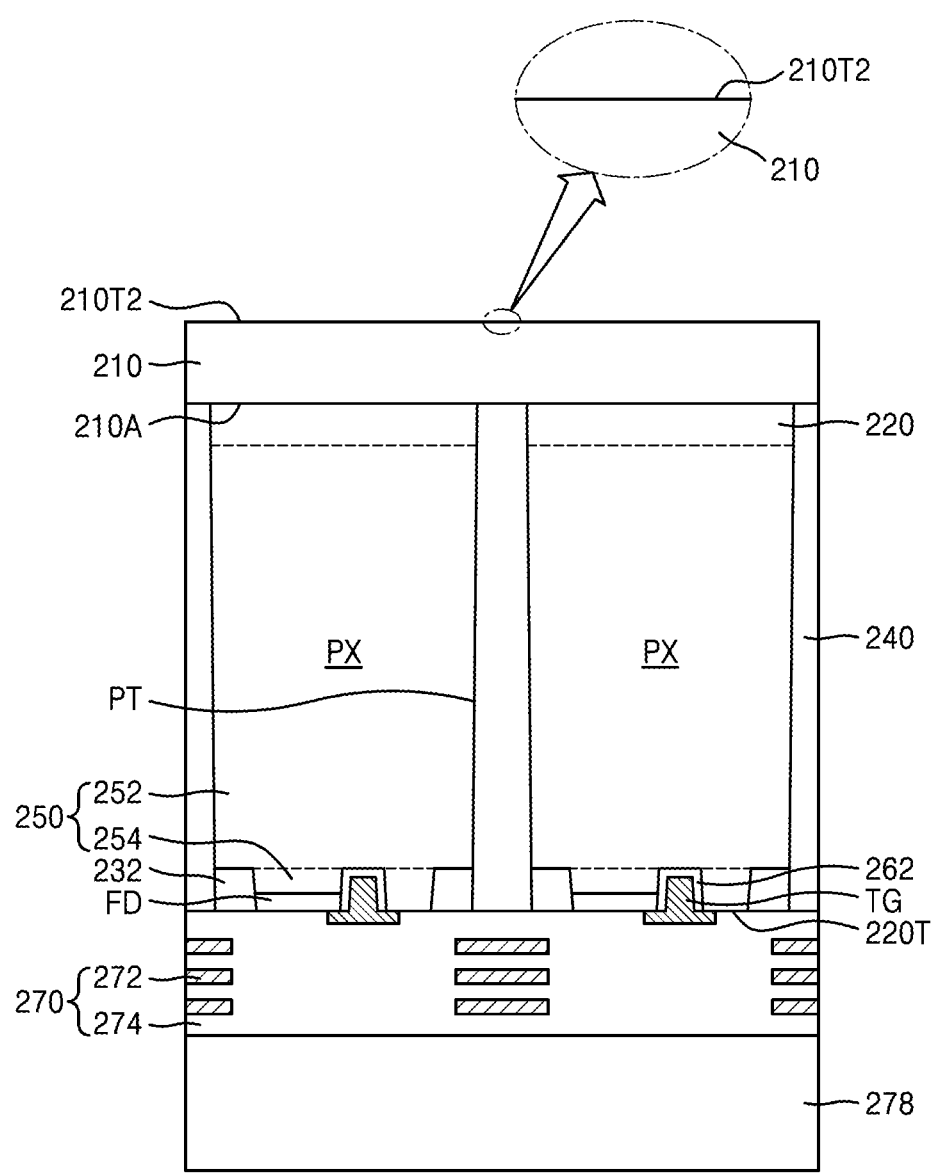

Referring to FIG. 5F, in the resultant structure of FIG. 5E, the processed surface 210T1 of the silicon substrate 210 may be polished using a chemical mechanical polishing (CMP) process. Thus, the physical surface defects, such as the microscratches, may be removed from the processed surface 210T1 of the silicon substrate 210, and the surface roughness of the processed surface 210T1 of the silicon substrate 210 may be reduced to provide a smooth processed surface 210T2.

In example embodiments, the CMP process may be performed using a slurry including abrasives, a pH control agent, and DIW. In some embodiments, the abrasives may include silica, and the pH control agent may include an alkali base, such as potassium hydroxide and sodium hydroxide, or a non-metallic inorganic or organic base, but the inventive concept is not limited thereto.

In example embodiments, the silicon substrate 210 having the smooth processed surface 210T2, which is polished using the CMP process, may have a thickness of about 10 μm to about 30 for example, about 15 μm to about 20 μm.

Figure 5G:
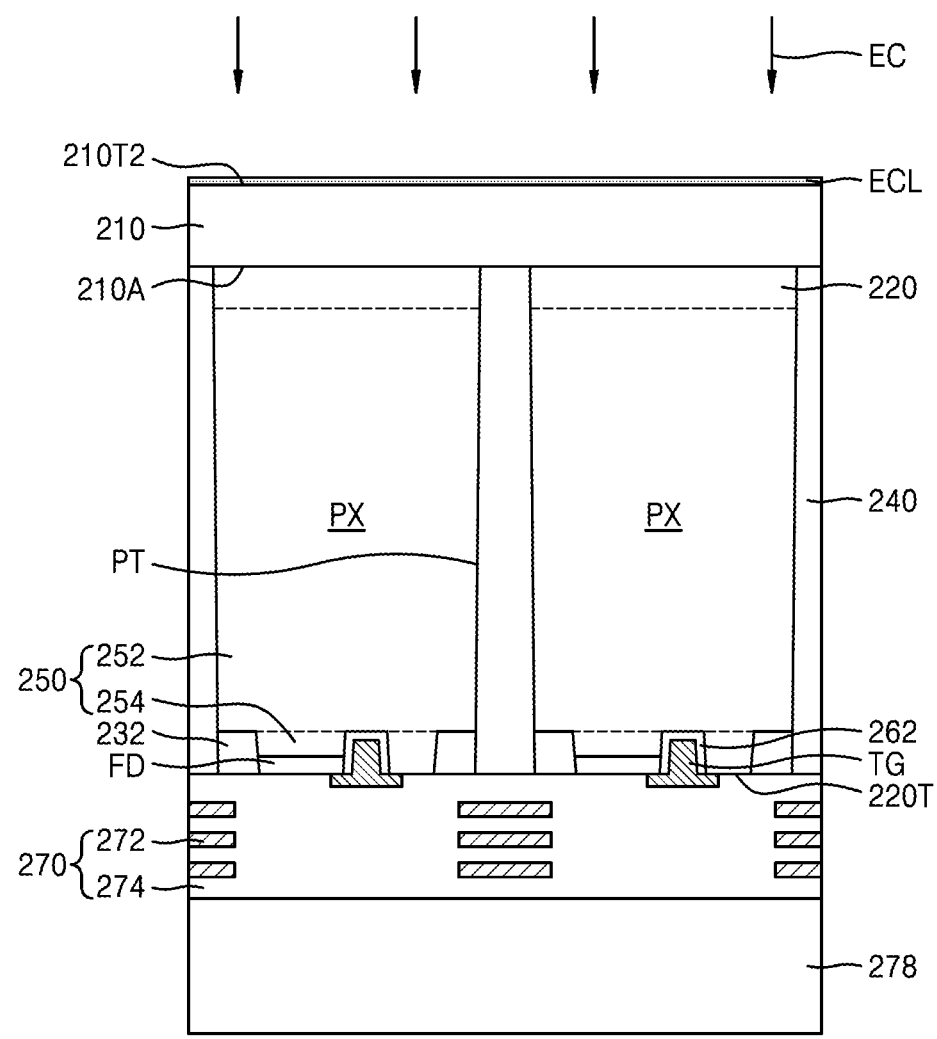

Referring to FIG. 5G, in the resultant structure of FIG. 5F, which includes the silicon substrate 210 polished using the CMP process, an etchant composition EC may be supplied to the smooth processed surface 210T2 of the silicon substrate 210 to form an etchant composition coating layer ECL covering the smooth processed surface 210T2 of the silicon substrate 210. While the smooth processed surface 210T2 of the silicon substrate 210 is being covered by the etchant composition coating layer ECL, the resultant structure may be left to sit for a predetermined time to structurally modify at least a portion of the silicon substrate 210. The process of forming the etchant composition coating layer ECL and the process of structurally modifying at least the portion of the silicon substrate 210 may be understood in further detail with reference to the process of forming the etchant composition coating layer ECL and the process of modifying the silicon film 102, which have been described with reference to FIG. 4A. While the resultant structure is being left to sit for the predetermined time with the processed surface 210T2 of the silicon substrate 210 covered by the etchant composition coating layer ECL, at least the portion of the silicon substrate 210 may be structurally modified in a similar manner to the silicon film 102 described with reference to FIG. 4A.

Figure 5H:
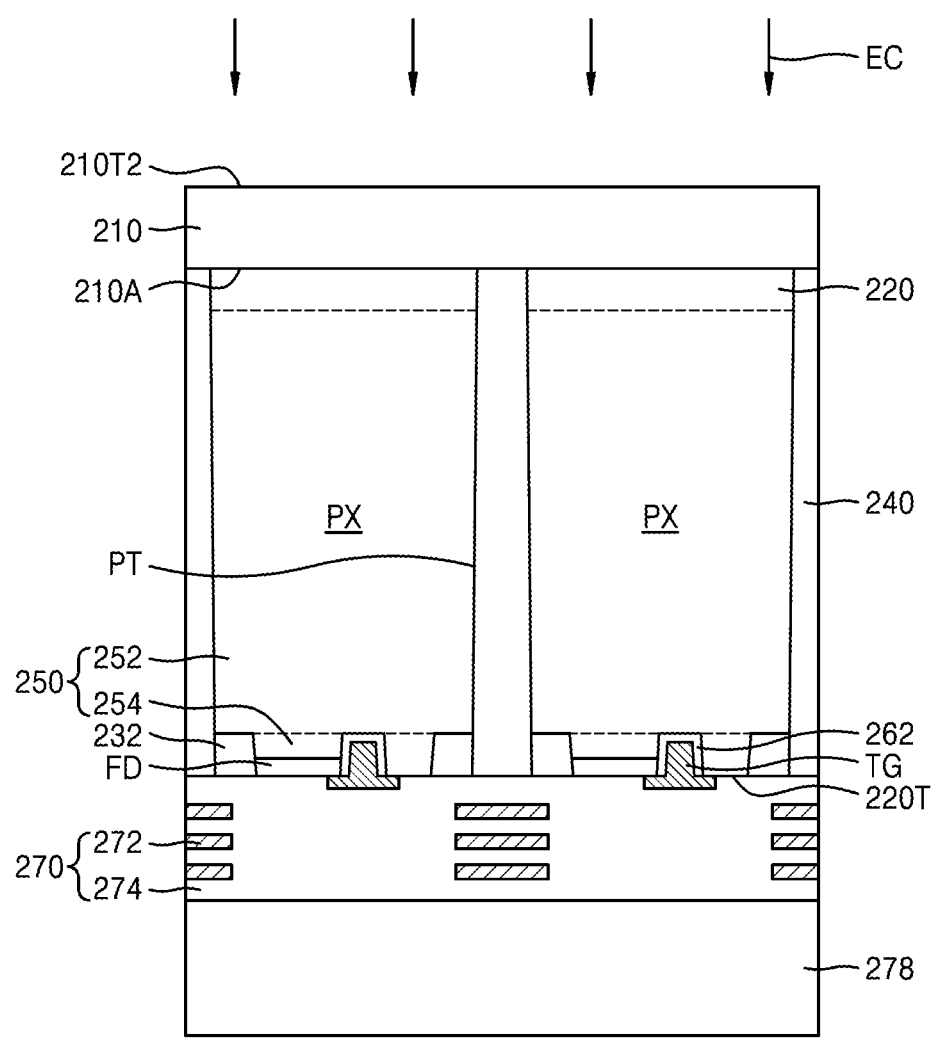

Referring to FIG. 5H, the silicon substrate 210 may be etched by supplying the etchant composition EC onto the silicon substrate 210 of which at least the portion is structurally modified. A detailed description of the process of etching the silicon substrate 210 may be substantially the same as that of the process of etching the silicon film 102, which is provided with reference to FIG. 2B.

Figure 5I:
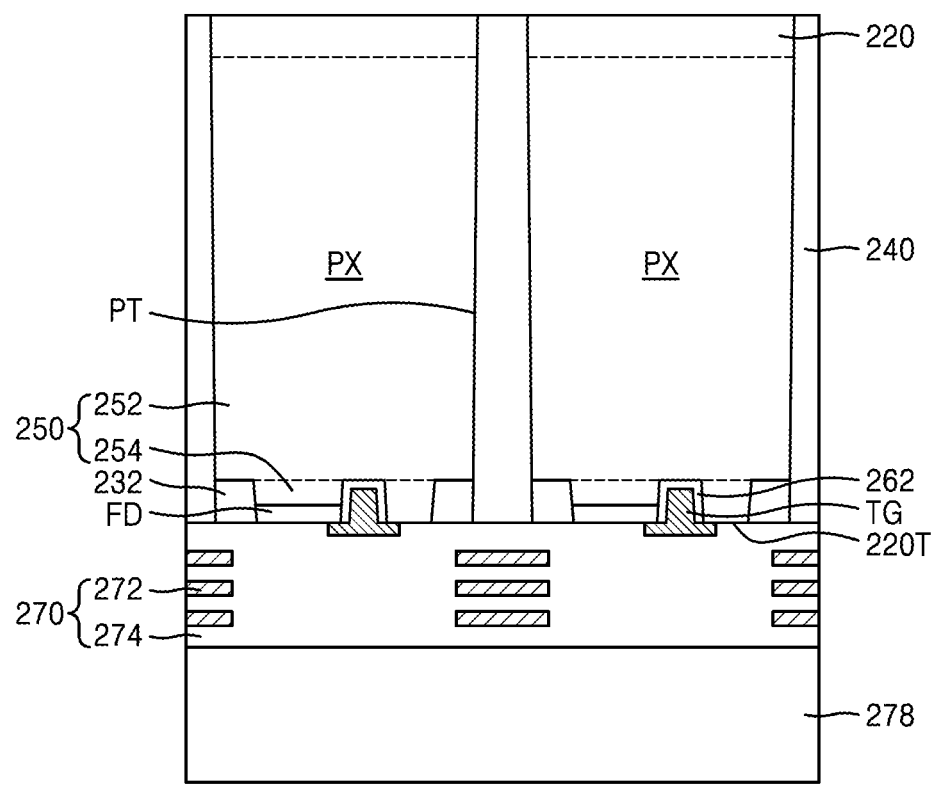

Referring to FIG. 5I, as described above with reference to FIG. 5H, the silicon substrate 210 may be etched using the etchant composition EC to expose the epitaxial film 220 and the pixel device isolation film 240. Thereafter, exposed surfaces of the epitaxial film 220 and the pixel device isolation film 240 may be cleaned and dried in a similar manner to process P30 described with reference to FIG. 1.

Figure 5J:
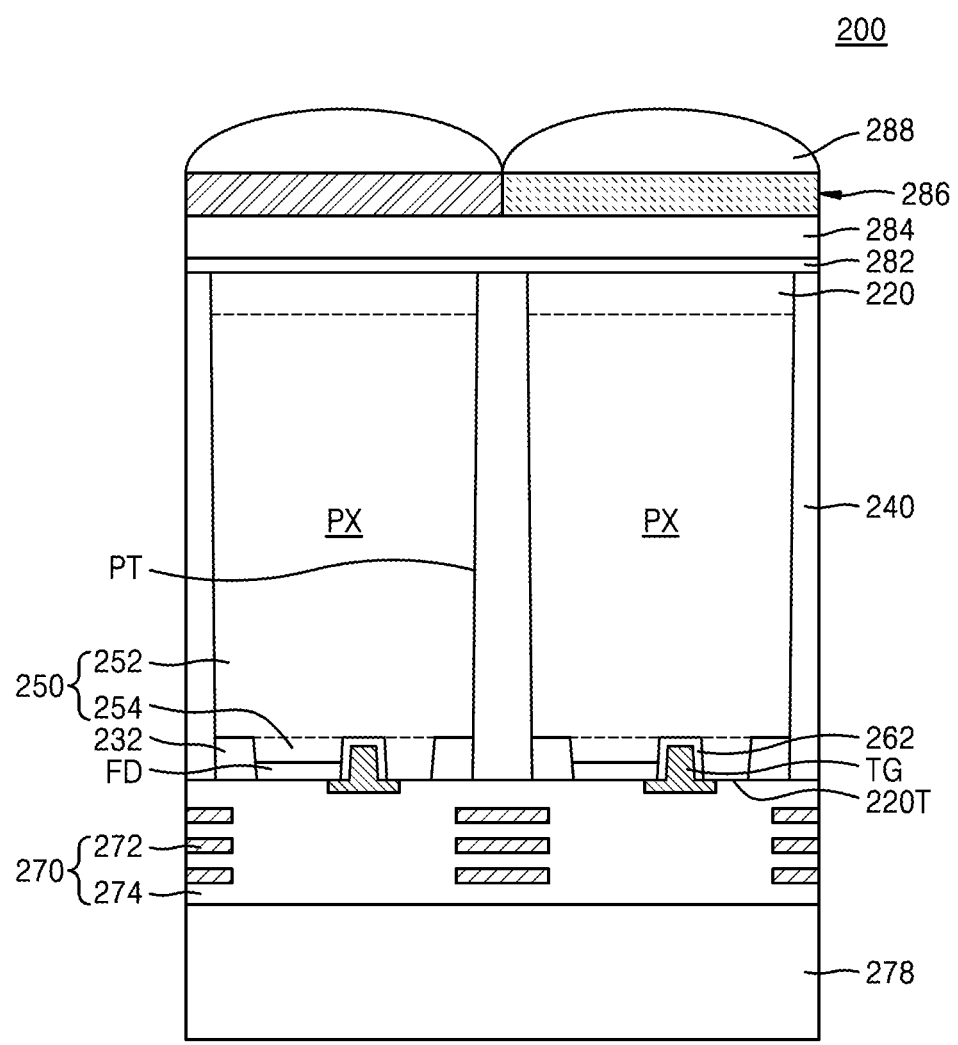

Referring to FIG. 5J, an anti-reflecting layer (ARL) 282 and a passivation film 284 may be formed on the epitaxial film 220 and the pixel device isolation film 240, and a color filter 286 and a microlens 288 may be formed on the passivation film 284, thereby forming an IC device 200.

In example embodiments, the ARL 282 may include a metal oxide (e.g., hafnium oxide, aluminum oxide, and tantalum oxide) or an insulating material, such as silicon oxide, silicon nitride, silicon oxynitride, and/or a low-k dielectric material. The passivation film 284 may include an insulating material, such as silicon oxide, silicon nitride, and/or silicon oxynitride.

In the method of manufacturing the IC device 200, according to some embodiments of the inventive concept, which is described with reference to FIGS. 5A to 5J, the silicon substrate 210 may be selectively etched in the epitaxial wafer EWF including the silicon substrate 210 and the epitaxial film 220, which have different dopant concentrations, by using the etchant composition EC according to some embodiments of the inventive concept. In this case, even when there is a relatively small difference in dopant concentration between the silicon substrate 210 and the epitaxial film 220, the silicon substrate 210 may be selectively removed from the epitaxial wafer EWF without adversely affecting the epitaxial film 220.

To manufacture the IC device 200, it may be necessary to gradually increase a thickness of the epitaxial film 220 for various purposes. For example, in the IC device 200 used as a complementary metal-oxide-semiconductor (CMOS) image sensor (CIS), a size of the pixel region PX may be reduced to improve the resolution of the CMOS image sensor. Thus, to overcome the photosensitive limit of pixels in the pixel region PX having the reduced size, it may be beneficial or necessary to increase a thickness of the epitaxial film 220. However, when the thickness of the epitaxial film 220 is increased, misfit dislocation may occur between the silicon substrate 210 and the epitaxial film 220. To reduce or possibly prevent the occurrence of the misfit dislocation between the silicon substrate 210 and the epitaxial film 220, it may be beneficial or necessary to reduce a difference in lattice constant therebetween. To this end, it may be beneficial or necessary to reduce a difference in dopant concentration between the silicon substrate 210 and the epitaxial film 220. Accordingly, even when the difference in dopant concentration between the silicon substrate 210 and the epitaxial film 220 is small enough to reduce or possibly prevent the misfit dislocation, by using the etchant composition EC according to the embodiment, the silicon substrate 210 may be selectively removed from the epitaxial film 220 without damaging the epitaxial film 220. Therefore, even when the thickness of the epitaxial film 220 formed on the silicon substrate 210 is gradually increased, and the difference in dopant concentration between the silicon substrate 210 and the epitaxial film 220 is relatively reduced, the silicon substrate 210 may be selectively removed without damage to the epitaxial film 220 by using the etchant composition EC according to the embodiment. As a result, the performance and/or reliability of the IC device 200 including the epitaxial film 220 may be improved.

Next, specific examples for etching characteristics of etchant compositions according to some embodiments of the inventive concept will be described.

Evaluation Examples 1 to 15

Epitaxial wafer samples in which an epitaxial silicon film having a thickness of 15 μm was formed on a silicon substrate having a thickness of 19 μm were prepared. In each of the epitaxial wafer samples, the silicon substrate was doped with B atoms at a dopant concentration of $5.0 \times 10^{17}$ atoms/cm$^3$, and the epitaxial silicon film was doped with boron atoms at a dopant concentration of $1.0 \times 10^{15}$ atoms/cm$^3$.

Etching characteristics of etchant compositions having various contents and content ratios according to Evaluation examples 1 to 15 were evaluated by dipping the epitaxial wafer samples in the etchant compositions and stirring the etchant compositions for 10 minutes. By measuring variations in thicknesses of the epitaxial wafer samples to be evaluated before and after evaluation, etch rates of the silicon substrate and the epitaxial silicon film were confirmed, and the measured and confirmed results are shown in Table 1.

TABLE 1

| | Content (wt %) | | | | | | Etch rate (μm/min) | |
|---|---|---|---|---|---|---|---|---|
| | Nitric acid | Fluoric acid | Phosphoric acid | Acetic acid | Nitrogen compound | Water | SUB | EPI |
| Evaluation example 1 | 13.6 | 6.5 | 27.7 | 15.9 | A 2.1 | Residual amount | ◎ | ◎ |
| Evaluation example 2 | 18.8 | 4.3 | 21.1 | 20.0 | A 2.6 | Residual amount | ○ | ◎ |
| Evaluation example 3 | 18.8 | 4.3 | 21.1 | 20.0 | B 1.5 | Residual amount | ◎ | ◎ |
| Evaluation example 4 | 11.1 | 13.3 | 10.8 | 39.4 | A 2.6 | Residual amount | ◎ | ○ |
| Evaluation example 5 | 11.1 | 13.3 | 10.8 | 39.4 | C 5.0 | Residual amount | ○ | ◎ |
| Evaluation example 6 | 11.1 | 13.3 | 10.8 | 39.4 | D 5.0 | Residual amount | ○ | ◎ |

TABLE 1-continued

| | Content (wt %) | | | | | | Etch rate (μm/min) | |
|---|---|---|---|---|---|---|---|---|
| | Nitric acid | Fluoric acid | Phosphoric acid | Acetic acid | Nitrogen compound | Water | SUB | EPI |
| Evaluation example 7 | 11.1 | 13.3 | 10.8 | 39.4 | E 4.2 | Residual amount | ⊚ | ○ |
| Evaluation example 8 | 11.1 | 13.3 | 10.8 | 39.4 | F 5.0 | Residual amount | ⊚ | ○ |
| Evaluation example 9 | 11.1 | 13.3 | 10.8 | 39.4 | G 2.0 | Residual amount | ⊚ | ⊚ |
| Evaluation example 10 | 11.1 | 13.3 | 10.8 | 39.4 | H 2.8 | Residual amount | ⊚ | ⊚ |
| Evaluation example 11 | 11.1 | 13.3 | 10.8 | 39.4 | I 3.0 | Residual amount | ⊚ | ⊚ |
| Evaluation example 12 | 11.1 | 13.3 | 10.8 | 39.4 | J 3.0 | Residual amount | ⊚ | ⊚ |
| Evaluation example 13 | 11.1 | 13.3 | 10.8 | 39.4 | K 0.9 | Residual amount | ⊚ | ○ |
| Evaluation example 14 | 11.1 | 13.3 | 10.8 | 39.4 | L 0.7 | Residual amount | ⊚ | ○ |
| Evaluation example 15 | 11.1 | 13.3 | 10.8 | 39.4 | M 0.7 | Residual amount | ⊚ | ○ |

In Table 1, specific materials of nitrogen compounds A to M are as follows.
Nitrogen compound A: ammonium fluoride
Nitrogen compound B: ammonium bifluoride
Nitrogen compound C: ammonium acetate
Nitrogen compound D: ammonium phosphate monobasic
Nitrogen compound E: tetramethylammonium fluoride
Nitrogen compound F: tetrabutylammonium fluoride
Nitrogen compound G: tetramethylammonium hydroxide
Nitrogen compound H: urea
Nitrogen compound I: urea phosphate
Nitrogen compound J: urea nitrate
Nitrogen compound K: phenyl urea
Nitrogen compound L: 4-amino-1,2,4-triazole
Nitrogen compound M: 3-amino-5-methyl-1,2,4-triazole "Residual amount of water" as used herein refers to water present as the rest of the etchant composition (i.e., water constitutes the remainder of the etchant composition).

To evaluate an etch rate of a silicon substrate SUB, thicknesses of the silicon substrate SUB before and after evaluation were measured using a micrometer. To evaluate an etch rate of an epitaxial silicon film EPI, thicknesses of the epitaxial silicon film EPI before and after evaluation were measured using a field emission scanning electron microscope (FE-SEM).

In Table 1, in the case of the silicon substrate SUB, "⊚" indicates that the etch rate is higher than 4 μm/min, "○" indicates that the etch rate is higher than 3 μm/min and lower than or equal to 4 μm/min, "Δ" indicates that the etch rate is higher than 2 μm/min and lower than or equal to 3 μm/min, and "x" indicates that the etch rate is higher than or equal to 0 μm/min and lower than or equal to 2 μm/min. In the case of the epitaxial silicon film EPI, "⊚" indicates that the etch rate is higher than or equal to 0 μm/min and lower than or equal to 0.15 μm/min, "○" indicates that the etch rate is higher than 0.15 μm/min and lower than or equal to 0.2 μm/min, "Δ" indicates that the etch rate is higher than 0.2 μm/min and lower than or equal to 0.3 μm/min, and "x" indicates that the etch rate is higher than 0.3 μm/min.

As can be seen from the results of Table 1, when each of the etchant compositions of Evaluation examples 1 to 15 was used, both an etch rate of the silicon substrate SUB and an etch rate of the epitaxial silicon film EPI were at satisfactory levels. From the results of Table 1, it can be seen that the etchant compositions of Evaluation examples 1 to 15 may be effectively used to selectively etch the silicon substrate SUB, from among the silicon substrate SUB and the epitaxial silicon film EPI.

Comparative Examples 1 to 5

Comparative epitaxial wafer samples having the same structures as the epitaxial wafer samples used in Evaluation examples 1 to 15 were prepared. Etching characteristics of etchant compositions having various contents and content ratios according to Comparative examples 1 to 5 were evaluated by dipping the comparative epitaxial wafer samples in the etchant compositions and stirring the etchant compositions for 10 minutes. When each of the etchant compositions according to Comparative examples 1 to 5 was used, variations in thicknesses of the comparative epitaxial wafer samples before and after evaluation were measured in the same manner as in Evaluation examples 1 to 15, etch rates of a silicon substrate and an epitaxial silicon film were confirmed, and the measured and confirmed results are shown in Table 2.

TABLE 2

| | Content (wt %) | | | | | | Etch rate (μm/min) | |
|---|---|---|---|---|---|---|---|---|
| | Nitric acid | Fluoric acid | Phosphoric acid | Acetic acid | Other compound | Water | SUB | EPI |
| Comparative example 1 | 20.5 | 4.1 | 9.9 | 50.9 | — | Residual amount | Δ | Δ |
| Comparative example 2 | 11.1 | 13.3 | 10.8 | 39.4 | — | Residual amount | ⊚ | X |

TABLE 2-continued

| | Content (wt %) | | | | | | Etch rate (μm/min) | |
|---|---|---|---|---|---|---|---|---|
| | Nitric acid | Fluoric acid | Phosphoric acid | Acetic acid | Other compound | Water | SUB | EPI |
| Comparative example 3 | 20.9 | 4 | — | 47.41 | N 5 | Residual amount | X | ⊚ |
| Comparative example 4 | 28.6 | 6.25 | — | 40.42 | O 7 | Residual amount | ⊚ | X |
| Comparative example 5 | 28.6 | 6.25 | — | 40.42 | P 7 | Residual amount | ⊚ | X |

In Table 2, specific materials of other compounds N, O, and P are as follows.

Other compound N: ammonium phosphate dibasic
Other compound O: dodecyl benzene sulfonic acid
Other compound P: methane sulfonic acid In the results of Table 2, when each of the etchant compositions according to Comparative examples 1 and 2 was a composition including nitric acid, fluoric acid, phosphoric acid, and acetic acid, an etch rate of a silicon substrate SUB was generally good, but an etch rate of an epitaxial silicon film EPI was excessively high. The etchant composition according to Comparative example 3 included nitric acid, fluoric acid, acetic acid, and an ammonium-based compound, and each of the etchant compositions according to Comparative examples 4 and 5 included nitric acid, fluoric acid, acetic acid, and a sulfonic acid-based compound. When each of the etchant compositions according to Comparative examples 3, 4, and 5 was used, an etch rate of a silicon substrate SUB was excessively low or an etch rate of an epitaxial silicon film EPI was excessively high.

In the etchant compositions according to some embodiments of the inventive concept, even when a difference in dopant concentration between a silicon film and an epitaxial film is relatively small in a structure in which the silicon film is in contact with the epitaxial film, the silicon film may be selectively removed from the substrate without adversely affecting the epitaxial film.

While the inventive concept has been particularly shown and described with reference to example embodiments thereof, it will be understood that various changes in form and details may be made therein without departing from the scope of the following claims.

What is claimed is:

1. An etchant composition consisting essentially of: nitric acid in an amount of 10% to 20% by weight of the etchant composition; fluoric acid in an amount of 1% to 15% by weight of the etchant composition; phosphoric acid in an amount of 5% to 30% by weight of the etchant composition; acetic acid in an amount of 10% to 50% by weight of the etchant composition; a nitrogen compound in an amount of 0.5% to 10% by weight of the etchant composition; and
water;
wherein the nitrogen compound comprises ammonium hydroxide, tetramethylammonium hydroxide, tetraethylammonium hydroxide, tetrabutylammonium hydroxide, urea, urea phosphate, urea nitrate, imidazolidinyl urea, phenylurea, 1,1-diphenyl urea, 1,3-diphenyl urea, hydroxyurea, 1,1-dimethyl urea, or a combination thereof.

2. The etchant composition of claim 1, wherein the nitrogen compound comprises ammonium hydroxide, tetramethylammonium hydroxide, tetraethylammonium hydroxide, tetrabutylammonium hydroxide, or a combination thereof.

3. The etchant composition of claim 1, wherein the nitrogen compound comprises urea, urea phosphate, urea nitrate, imidazolidinyl urea, phenylurea, 1,1-diphenyl urea, 1,3-diphenyl urea, hydroxyurea, 1,1-dimethyl urea, or a combination thereof.

4. The etchant composition of claim 1, wherein the etchant composition is configured to etch a single-crystalline silicon film doped with a P-type dopant.

5. The etchant composition of claim 1, wherein the etchant composition is configured to etch a silicon film that is doped with boron (B) atoms at a concentration of $1.0 \times 10^{17}$ atoms/cm$^3$ to $5.0 \times 10^{18}$ atoms/cm$^3$.

6. The etchant composition of claim 1, wherein a weight percent of the nitrogen compound is lower than a weight percent of each of the nitric acid, the fluoric acid, the phosphoric acid, and the acetic acid.

7. The etchant composition of claim 1, wherein each of a weight percent of the nitric acid, a weight percent of the phosphoric acid, and a weight percent of the acetic acid is at least twice a weight percent of the nitrogen compound.

8. The etchant composition of claim 1, wherein a weight percent of the nitric acid is lower than a weight percent of the acetic acid.

* * * * *